(12) United States Patent
Hasebe et al.

(10) Patent No.: US 6,333,213 B2
(45) Date of Patent: Dec. 25, 2001

(54) METHOD OF FORMING PHOTOMASK AND METHOD OF MANUFACTURING SEMICONDUCTOR DEVICE

(75) Inventors: Shigeru Hasebe, Yokohama; Mineo Goto, Kawasaki; Osamu Ikenaga, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/748,168

(22) Filed: Dec. 27, 2000

(30) Foreign Application Priority Data

Dec. 28, 1999 (JP) .................................................. 11-373343

(51) Int. Cl.$^7$ .............................. H01L 21/82; H01L 21/24
(52) U.S. Cl. .......................... 438/129; 438/599; 438/926
(58) Field of Search ..................................... 438/129, 587, 438/48, 62, 108, 128, 130, 599, 926; 257/202, 207

(56) References Cited

U.S. PATENT DOCUMENTS

| | | | |
|---|---|---|---|
| 5,610,831 | * 3/1997 | Matsumoto | 364/491 |
| 5,723,234 | 3/1998 | Yokoyama et al. | |
| 5,736,300 | * 4/1998 | Mizuno et al. | 430/311 |
| 5,770,518 | * 6/1998 | Shen | 438/631 |
| 5,899,706 | 5/1999 | Kluwe et al. | |
| 5,922,217 | * 7/1999 | Lee | 216/24 |
| 6,099,992 | 8/2000 | Motoyama et al. | |
| 6,194,252 | * 2/2001 | Yamaguchi | 438/129 |
| 6,207,479 | * 3/2001 | Liew et al. | 438/129 |
| 6,232,154 | * 5/2001 | Reith et al. | 438/129 |
| 6,233,722 | * 5/2001 | LaBerge | 438/129 |

FOREIGN PATENT DOCUMENTS

| | | |
|---|---|---|
| 62-1246 | 1/1987 | (JP) . |
| 10-178013 | 6/1998 | (JP) . |

* cited by examiner

Primary Examiner—Michael Lebentritt
(74) Attorney, Agent, or Firm—Finnegan, Henderson, Farabow, Garrett & Dunner, L.L.P.

(57) ABSTRACT

Resist film patterns are formed on a light shielding film formed on a surface of the glass substrate. The resist film patterns cover regions A and B of the surface of the substrate. Then, using the resist film patterns as a mask, the light shielding film is patterned to form the light shielding film pattern in the regions A and B. The light shielding film pattern formed in region B is used as a dummy pattern. Then, a further resist film is formed over the light shielding film patterns of the regions A and B. The resist film is patterned to provide only a resist film pattern covering the region A. Thereafter, an etching processing is applied for removing the light shielding film pattern in the region B using the resist film pattern as a mask. In this method, the presence of the dummy pattern is an important feature.

38 Claims, 7 Drawing Sheets

METHOD OF FORMING PHOTOMASK AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 11-373343, filed Dec. 28, 1999, the entire contents of which are incorporated herein by reference.

BACKGROUND OF THE INVENTION

The present invention relates to a method of forming a pattern of a photomask used in the manufacture of a semiconductor device, a liquid crystal substrate and the like, and a method of forming a semiconductor device using the photomask.

In the conventional method of forming a pattern, for example a metal film pattern, on a substrate, a metal film is deposited on the entire surface of a substrate, followed by coating the entire surface of the metal film with a photoresist. Then, the photoresist is selectively exposed to light by using a photomask, followed by developing the patterned photoresist so as to form a resist film pattern. Thereafter, the metal film is selectively exposed to light by using the resist film pattern as a mask, followed by developing the exposed metal film so as to form a metal film pattern. This is also the case with the manufacturing method of a semiconductor device. Specifically, a metal film, i.e. a conductive film, is deposited on the entire surface of a semiconductor substrate, followed by coating the entire surface of the conductive film with a photoresist. Then, the photoresist is selectively exposed to light by using a mask, followed by developing the patterned photoresist so as to form a resist film pattern. Thereafter, the conductive film is subjected to etching by using the resist film pattern as a mask, so as to form a wiring or a gate electrode.

Figure 10A:
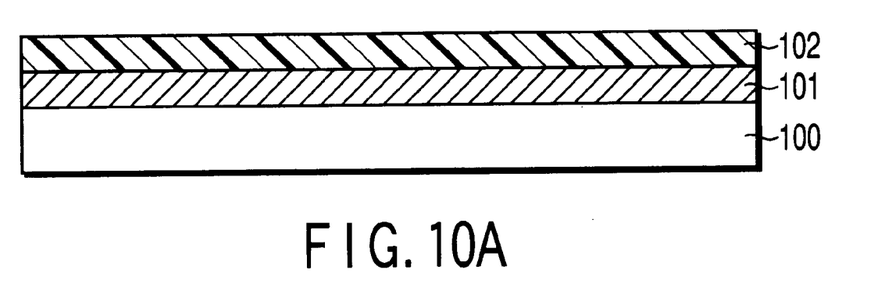
FIGS. 10A to 10C are cross sectional views collectively showing the conventional process of forming a photomask.
Figure 10B:
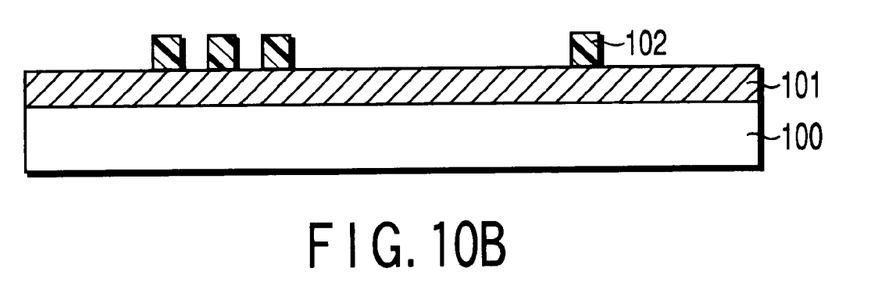
Figure 10C:
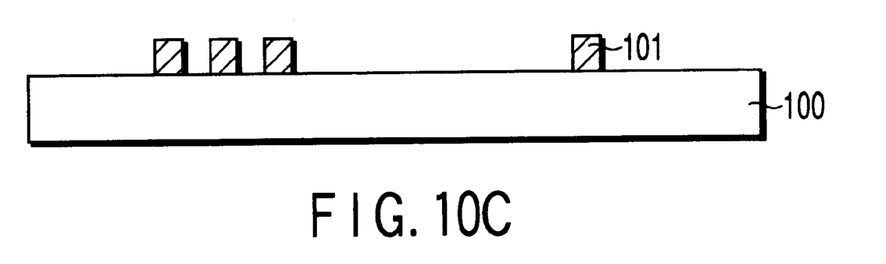

FIGS. 10A to 10C are cross sectional views collectively showing a conventional method of forming a wiring pattern or a gate electrode on a semiconductor substrate by using a photomask. In the first step, a light shielding film 101 consisting of chromium (Cr) is formed on the entire main surface of a transparent substrate 100 such as a glass substrate. Then, the entire surface of the light shielding film 101 is coated with a positive or negative resist 102, as shown in FIG. 10A. Then, a predetermined pattern is depicted on the resist layer 102 by irradiating the resist layer 102 with a light or an electron beam in a predetermined pattern, followed by developing the depicted pattern so as to form a resist film pattern 102, as shown in FIG. 10B. Further, the light shielding film 101 is selectively etched with the resist film pattern 102 used as a mask so as to form a light shielding film pattern 101. Then, the resist film pattern 102 is removed. As a result, a photomask consisting of the transparent substrate 100 and the light shielding film pattern 101 is formed, as shown in FIG. 10C.

The photomask is constructed in conformity with a circuit pattern of, for example, a wiring and a gate formed on a semiconductor substrate. To be more specific, the photomask comprises a transparent substrate such as a glass substrate, and light shielding film patterns e.g. chromium film patterns, formed on the main surface of the transparent substrate. The light shielding film patterns may be arranged collectively or at a high density in some region so as to form a collective or dense arrangement pattern and a single light shielding film pattern is independently formed in another region so as to form an independent or isolated arrangement pattern. The arrangement patterns are determined by the construction of a circuit formed on a semiconductor substrate. The main surface of the semiconductor substrate is classified into region A in which the light shielding film pattern or patterns are formed and region B in which the light shielding film pattern is not formed. In a region A in which the light shielding film patterns are collectively provided includes portions in which the light shielding film patterns are formed, portion or portions in which the light shielding film pattern is not formed, i.e., portion or portions located between the adjacent light shielding film patterns, and portions located between the outermost light shielding film pattern and region B. In another region A in which the single light shielding film pattern is independently provided includes a portion in which the light shielding film pattern is formed, and portions between the light shielding film pattern and region B. On the other hand, region B includes a portion in which nothing is formed on the main surface of the substrate.

In forming above mentioned photomask having collectively arranged light shielding film patterns and an independently arranged light shielding film pattern present together on the substrate, a difference in size is generated between the collectively arranged light shielding film patterns and the independently arranged light shielding film pattern. As a result, it is difficult to form a photomask having a uniform size of the collectively arranged light shielding film patterns and the independently arranged light shielding film pattern. Thus, if a resist film pattern is depicted by light or an electron beam in forming a mask, it is difficult to depict the pattern as designed because of the influence of the proximity effect. Further, in the step of developing the resist film, a size difference is generated depending on, for example, the regions developed. Also, in the step of etching the light shielding film by using the resist film as a mask, if a region, in which the etching amount is large in the etching step of the light shielding film, and another region, in which the etching amount is small, are present together, a size difference is also generated. As a result, it is difficult to form a wiring pattern and a gate pattern as designed on the semiconductor substrate. How to eliminate these difficulties is a serious problem to be solved in forming a photomask.

BRIEF SUMMARY OF THE INVENTION

An object of the present invention, which has been achieved in an attempt to eliminate the above-noted difficulties, is to provide a method of forming a photomask including the collectively arranged light shielding film patterns and an independently arranged light shielding film pattern, which method diminishes the difference between the size of the light shielding film patterns in the collective arrangement pattern and the size of a light shielding film pattern in the independent arrangement pattern, and a method of manufacturing a semiconductor device by using the particular photomask.

In the present invention, a light shielding film is formed on the entire surface of a glass substrate and then a resist film is formed on the light shielding film. In forming a resist film pattern by irradiating the resist film with a light or an electron beam, developing the irradiated resist film, and then etching, the resist film is so patterned that not only a resist film pattern covering region A of the surface of the glass substrate but also a resist film pattern covering region B of the surface of the glass substrate are provided. Then, using the resist film patterns as masks, the light shielding film is patterned by etching so that a light shielding film pattern is formed not only in the region A but also the region B. The light shielding film pattern formed in region B is used as a dummy pattern. Then, a further resist film is formed by coating on the transparent substrate to cover the light shielding film patterns in the region A and the region B. The further resist film is patterned by irradiating thereonto with a light or an electron beam, developing the irradiated resist film, and then etching, so that only a further resist film pattern covering the region A is provided. Thereafter, an etching treatment is applied for removing the light shielding film pattern in the region B using the further resist film pattern as a mask. As the result, the light shielding film pattern, i.e. dummy pattern, is removed from the region B so as to prepare a photomask in which the light shielding film pattern is formed in region A alone. It should be noted that the presence of the dummy pattern formed in the step of forming the photomask permits diminishing the difference between the size of the light shielding film patterns in the collective arrangement pattern and the size of a light shielding film pattern in the independent arrangement pattern.

A method of forming a photomask according to a first aspect of the present invention, comprises the steps of:

successively laminating a light shielding film and a first resist film on a surface of a transparent substrate;

patterning the first resist film to form a first resist film pattern;

etching the light shielding film with the first resist film pattern used as a mask so as to form a single light shielding film pattern of the light shielding film in a form of an independent arrangement pattern and a plurality of light shielding film patterns of the light shielding film in a form of a collective arrangement pattern in a first region of the surface of the transparent substrate and a dummy pattern of the light shielding film in a second region of the surface of the transparent substrate;

removing the first resist film pattern;

forming a second resist film on the surface of the transparent substrate to cover the light shielding film patterns in the first regions and the second regions of the surface of the transparent substrate;

patterning the second resist film to form a second resist film pattern on the first region of the surface of the transparent substrate; and removing by etching the dummy pattern in the second region with the second resist film pattern used as a mask.

In the method of forming a photomask according to the first aspect of the present invention, the light shielding film pattern and the dummy pattern may comprise a chromium film or a translucent phase shift film. The translucent phase shift film may comprise a light shielding film made of a chromium compound or a molybdenum silicide compound. The chromium compound of the light shielding film may be chromium fluoride. The molybdenum silicide compound of the light shielding film may be oxynitride molybdenum silicide.

In the method of forming a photomask according to the first aspect of the present invention, the second region may have a region in which the light shielding film is not formed, and an optional value may be selected as the covering ratio in the second region of the light shielding film in accordance with the etching conditions of the light shielding film pattern.

In the method of forming a photomask according to the first aspect of the present invention, the method may further comprise, the step performed after the step removing by etching the dummy pattern in the second region, of removing the second resist film pattern. The light shielding film pattern and the dummy pattern may comprise a chromium film or a translucent phase shift film. The translucent phase shift film may comprise a light shielding film made of a chromium compound or a molybdenum silicide compound. The chromium compound of the light shielding film may be chromium fluoride. The molybdenum silicide compound of the light shielding film may be oxynitride molybdenum silicide.

In the method of forming a photomask according to the first aspect of the present invention, the second region may have a region in which the light shielding film is not formed, and an optional value may be selected as the covering ratio in the second region of the light shielding film in accordance with the etching conditions of the light shielding film pattern.

A method of forming a photomask according to a second aspect of the present invention, comprises the steps of:

forming a light shielding film on a surface of a transparent substrate;

forming a first resist film pattern on the light shielding film;

etching the light shielding film with the first resist film pattern used as a mask so as to form a single light shielding film pattern of the light shielding film in a form of an independent arrangement pattern and a plurality of light shielding film patterns of the light shielding film in a form of a collective arrangement pattern in a first region of the surface of the transparent substrate and a dummy pattern of the light shielding film in a second region of the surface of the transparent substrate;

removing the first resist film pattern;

forming a second resist film pattern on the surface of the transparent substrate to cover the light shielding film patterns in the first region of the surface of the transparent substrate; and removing by etching the dummy pattern in the second region with the second resist film pattern used as a mask.

In the method of forming a photomask according to the second aspect of the present invention, the light shielding film pattern and the dummy pattern may comprise a chromium film or a translucent phase shift film. The translucent phase shift film may comprise a light shielding film made of a chromium compound or a molybdenum silicide compound. The chromium compound of the light shielding film may be chromium fluoride. The molybdenum silicide compound of the light shielding film may be oxynitride molybdenum silicide.

In the method of forming a photomask according to the second aspect of the present invention, the second region may have a region in which the light shielding film is not formed, and an optional value may be selected as the covering ratio in the second region of the light shielding film in accordance with the etching conditions of the light shielding film pattern.

In the method of forming a photomask according to the second aspect of the present invention, the method may further comprise, the step performed after the step removing by etching the dummy pattern in the second region, of removing the second resist film pattern. The light shielding film pattern and the dummy pattern may comprise a chromium film or a translucent phase shift film. The translucent phase shift film may comprise a light shielding film made of a chromium compound or a molybdenum silicide compound. The chromium compound of the light shielding film may be chromium fluoride. The molybdenum silicide compound of the light shielding film may be oxynitride molybdenum silicide.

In the method of forming a photomask according to the second aspect of the present invention, the second region may have a region in which the light shielding film is not formed, and an optional value may be selected as the covering ratio in the second region of the light shielding film in accordance with the etching conditions of the light shielding film pattern.

A method of manufacturing a semiconductor device according to a third aspect of the present invention, comprises the steps of:

forming a workpiece film on a surface of a semiconductor substrate;

forming a photoresist film on the workpiece film;

transferring a predetermined pattern onto the photoresist film using a photomask;

developing the photoresist film having the pattern formed thereon and patterning the developed photoresist film to form a photoresist film pattern; and etching the workpiece film with the photoresist film pattern used as a mask to form film patterns of the workpiece film in a first portion of the surface of the semiconductor substrate and film patterns of the workpiece film in a second portion of the surface of the semiconductor substrate, wherein the photomask is a photomask formed by a method of forming a photomask, the method of forming the photomask comprising the steps of:

successively laminating a light shielding film and a first resist film on a surface of a transparent substrate;

patterning the first resist film to form a first resist film pattern;

etching the light shielding film with the first resist film pattern used as a mask so as to form a single light shielding film pattern of the light shielding film in a form of an independent arrangement pattern and a plurality of light shielding film patterns of the light shielding film in a form of a collective arrangement pattern in a first region of the surface of the transparent substrate and a dummy pattern of the light shielding film in a second region of the surface of the transparent substrate;

removing the first resist film pattern;

forming a second resist film on the surface of the transparent substrate to cover the light shielding film patterns in the first regions and the second regions of the surface of the transparent substrate;

patterning the second resist film to form a second resist film pattern on the first region of the surface of the transparent substrate; and removing by etching the dummy pattern in the second region with the second resist film pattern used as a mask.

In the method of manufacturing a semiconductor device according to the third aspect of the present invention, the film patterns of the workpiece film in the first portion of the surface of the semiconductor substrate may be arranged in a low density and the film patterns of the workpiece film in the second portion of the surface of the semiconductor substrate may be arranged in a high density.

In the method of manufacturing a semiconductor device according to the third aspect of the present invention, the film patterns in the first portion and the second portion may comprise conductor wirings or gate electrodes.

A method of manufacturing a semiconductor device according to a fourth aspect of the present invention, comprises the steps of:

forming a workpiece film on a surface of a semiconductor substrate;

forming a photoresist film on the workpiece film;

transferring a predetermined pattern onto the photoresist film using a photomask;

developing the photoresist film having the pattern formed thereon and patterning the developed photoresist film to form a photoresist film pattern; and etching the workpiece film with the photoresist film pattern used as a mask to form film patterns of the workpiece film in a first portion of the surface of the semiconductor substrate and film patterns of the workpiece film in a second portion of the surface of the semiconductor substrate, wherein the photomask is a photomask formed by a method of forming a photomask, the method of forming the photomask comprising the steps of:

forming a light shielding film on a surface of a transparent substrate;

forming a first resist film pattern on the light shielding film;

etching the light shielding film with the first resist film pattern used as a mask so as to form a single light shielding film pattern of the light shielding film in a form of an independent arrangement pattern and a plurality of light shielding film patterns of the light shielding film in a form of a collective arrangement pattern in a first region of the surface of the transparent substrate and a dummy pattern of the light shielding film in a second region of the surface of the transparent substrate;

removing the first resist film pattern;

forming a second resist film pattern on the surface of the transparent substrate to cover the light shielding film patterns in the first region of the surface of the transparent substrate; and removing by etching the dummy pattern in the second region with the second resist film pattern used as a mask.

In the method of manufacturing a semiconductor device according to the fourth aspect of the present invention, the film patterns of the workpiece film in the first portion of the surface of the semiconductor substrate may be arranged in a low density and the film patterns of the workpiece film in the second portion of the surface of the semiconductor substrate may be arranged in a high density.

In the method of manufacturing a semiconductor device according to the fourth aspect of the present invention, the film patterns in the first portion and the second portion may comprise conductor wirings or gate electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently

DETAILED DESCRIPTION OF THE INVENTION

Some embodiments of the present invention will now be described with reference to the accompanying drawings.

Figure 1A:
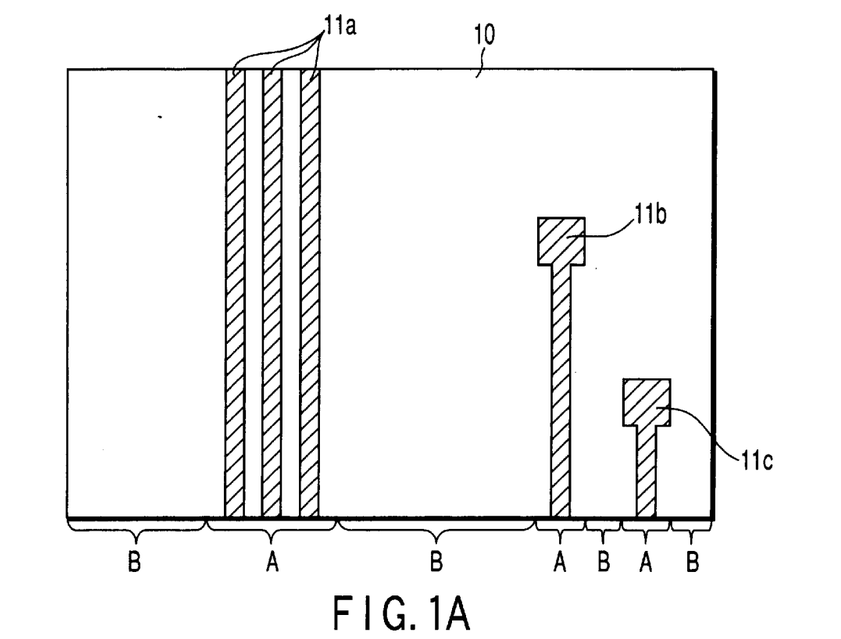
FIG. 1A is a plan view showing a photomask in which patterns of a light shielding film are formed.
Figure 1B:
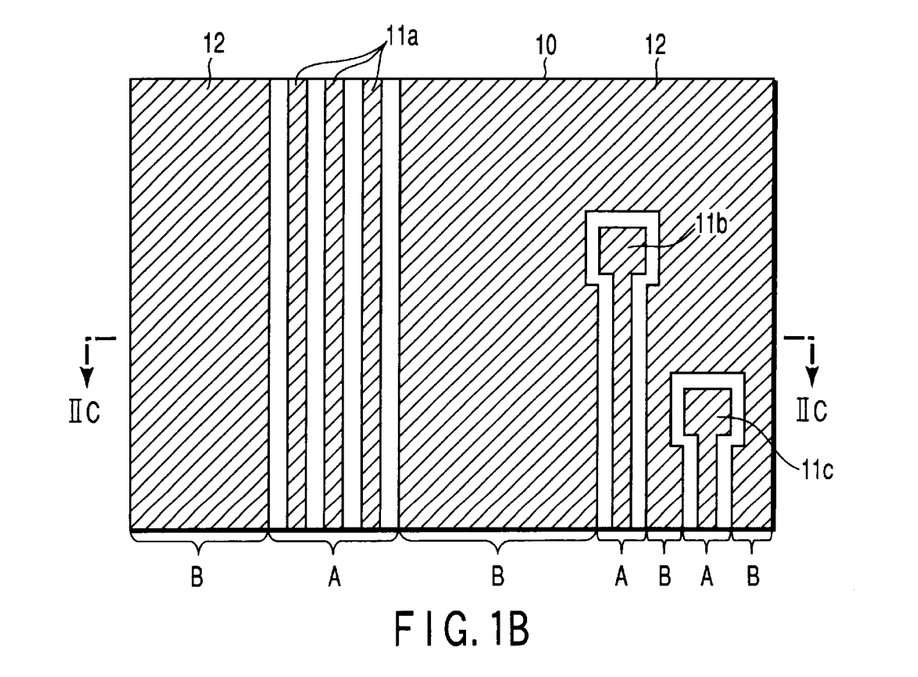
FIG. 1B is a plan view showing a photomask in a step of the manufacturing method according to the present invention.
Figure 2A:
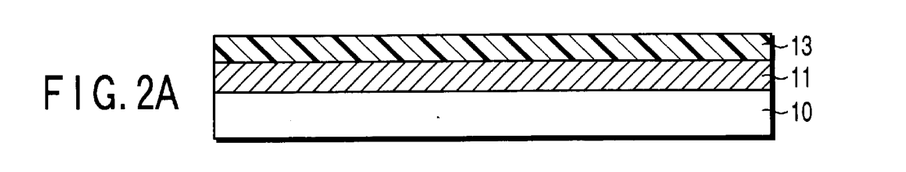
FIGS. 2A to 2D are cross sectional views collectively showing the manufacturing process of the photomask of the present invention.
Figure 2B:
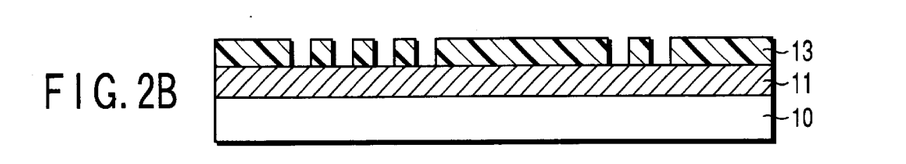
Figure 2C:
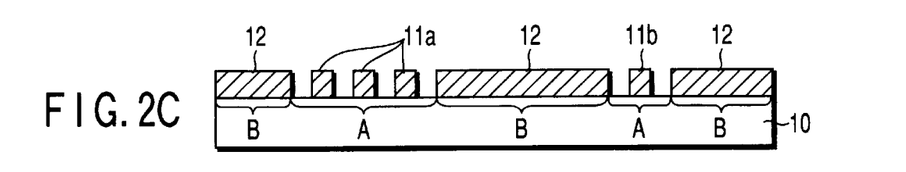
Figure 2D:
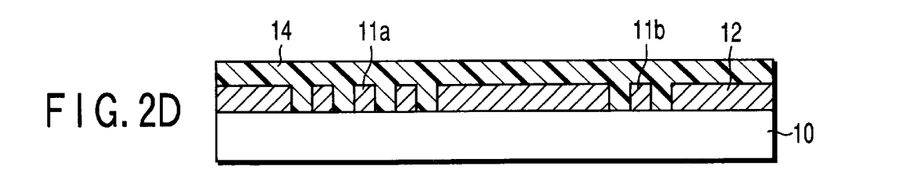
Figure 3A:
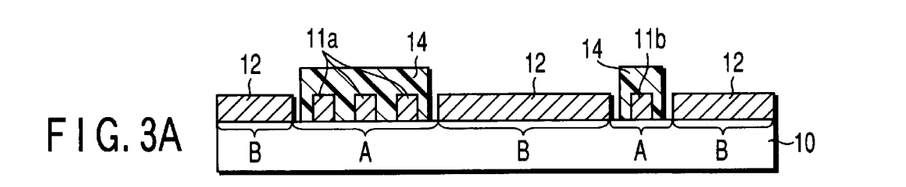
FIGS. 3A to 3C are cross sectional views collectively showing the manufacturing process of the photomask of the present invention.
Figure 3B:
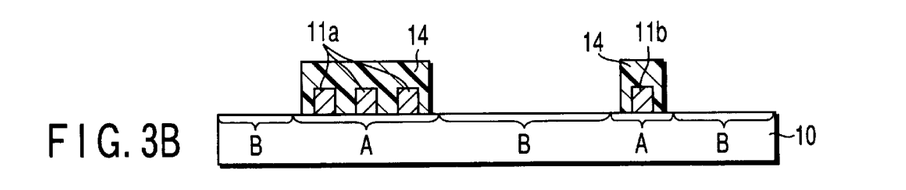
Figure 3C:
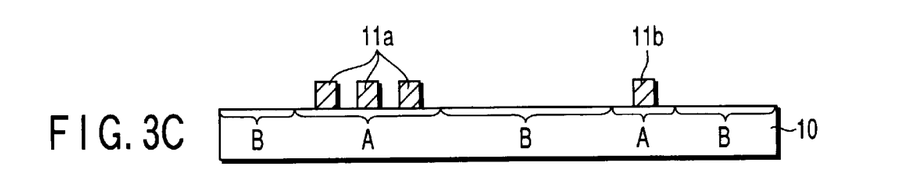

Specifically, FIG. 1A is a plan view showing a photomask. FIG. 1B is a plan view showing a photomask in a step of the manufacturing method according to the present invention. FIGS. 2A to 2D are cross sectional views collectively showing the manufacturing process of the photomask of the present invention. FIGS. 3A to 3C are cross sectional views collectively showing the manufacturing process of the photomask of the present invention. In the present invention, a photomask using a light shielding film such as a chromium film or a half tone type phase shift mask is used in general in the step of patterning a metal film formed on, for example, a silicon wafer. It is also possible to use a Levenson type phase shift mask. In this embodiment, used is a mask using a light shielding film such as a chromium film.

A light exposure device is used in the step of forming a pattern of a fine structure used for the manufacture of a semiconductor device or a liquid crystal device. The light exposure device used includes a so-called "stepper" such as a step and repeat type light exposure device, and a so-called "scanner" such as a step and scan type light exposure device. In the step and repeat type light exposure device, a pattern on a photomask is reduced to, for example, about ⅕ and is projected onto a wafer by light exposure. A wafer region for one chip to several chips is subjected to a light exposure at a time. The light exposure is successively performed while deviating the wafer region. In this fashion, the manufacturing process is performed while repeating the step (movement) and the light exposure for a single wafer. In this method, it is possible to form a pattern of a photomask larger than the pattern formed on the photoresist on the wafer and, thus, the photomask can be manufactured relatively easily. Also, the light exposure accuracy is high and the throughput is high.

The step and scan light exposure device is equal to the step and repeat type light exposure device in that the pattern of the photomask is reduced and projected. However, the step and scan light exposure device differs from the step and repeat type light exposure device in that the scanning is performed while synchronizing the photomask and the wafer during a single light exposure. Accordingly, in the step and scan light exposure device, an effective area of the projective lens is increased. Since the light exposure region is large, it is possible to form a large chip. It is of high importance nowadays to improve the resolution of the light exposure device in accordance with miniaturization of the semiconductor device. The present invention provides a photomask effective for coping with the particular subject matter. It is possible for the photomask of the present invention to form an accurate pattern in, for example, a photomask.

FIG. 1A is a plan view showing a photomask according to an embodiment according to the present invention. The photomask comprises a transparent substrate 10 such as a glass substrate and light shielding films patterns 11$a$, 11$b$ and 11$c$ made of chromium (Cr) and formed on a main surface of the transparent substrate 10. The light shielding film patterns are arranged collectively or at a high density in a region so as to form a collective or dense arrangement pattern and a single light shielding film pattern is independently formed in another region so as to form an independent or isolated arrangement pattern. In FIGS. 1A and 1B, three chromium film patterns 11$a$ are arranged at a high density, i.e., these chromium film patterns 11$a$ are collectively arranged in a form of the independent arrangement pattern. A single chromium film 11$b$ is formed independently. Also, another single chromium film 11$c$ is formed independently. That is, the three chromium films 11$a$ are arranged in a form of the collective arrangement pattern, while each of the single chromium film 11$b$ and the single chromium film 11$c$ is formed in a form of the independent arrangement pattern. These arrangement patterns are determined by the construction of a circuit formed on a semiconductor substrate. The light source used for the light exposure, which is known to the art, includes an ultraviolet light (i-line) of a mercury lamp, a KrF excimer laser beam having a wavelength of 248 nm, an ArF excimer laser beam having a wavelength of 193 nm, and an F2 excimer laser beam having a wavelength of 157 nm.

The present invention is featured in that, in order to diminish the difference between the size of the light shielding film patterns of the collective arrangement pattern and the size of the light shielding film pattern of the independent arrangement pattern in a photomask including these two types of arrangement patterns, a dummy pattern is formed on a transparent substrate in the manufacturing process of the photomask, and the dummy pattern is removed in the subsequent step so as to form a desired light shielding film pattern formation as shown in FIG. 1A.

The manufacturing process of the photomask will now be described with reference to FIGS. 2A to 2D and 3A to 3C. FIG. 2C is a cross sectional view along the line IIC—IIC shown in FIG. 1B. In the first step, a chromium film 11 is formed in a thickness of about 100 nm on a main surface of a transparent substrate 10 such as a glass substrate by a vacuum deposition method or a sputtering method. Then, a resist film 13 is formed by coating on the chromium film 11, as shown in FIG. 2A, followed by irradiating the resist film 13 with light or an electron beam so as to depict a pattern. Then, the resist film 13 is developed so as to form a resist film pattern 13, as shown in FIG. 2B. In the next step, chromium film patterns 11a, 11b, 11c, and 12 are formed by etching the chromium film 11 with the resist film pattern 13 used as a mask, as shown in FIG. 2C. Thereafter, the resist film pattern 13 is removed. As a result, light shielding film patterns 11a, 11b, 11c, and 12 made of chromium are formed on the surface of the transparent substrate such as a glass substrate. The surface of the transparent substrate includes a first region A and a second region B. Light shielding film patterns 11a, 11b, 11c are formed in the first region A, and light shielding film patterns 12 used as dummy patterns are formed on the entire surface of the second region B, as shown in FIG. 2C. In the present invention, a chromium-based metal film, a translucent phase shift film or the like is used as the light shielding film.

A chromium film is used in this embodiment. In the next step, a resist film 14 is formed on the main surface of the transparent substrate 10 in a manner to cover the light shielding film patterns, as shown in FIG. 2D, followed by irradiating the resist film 14 with light or an electron beam so as to depict a predetermined pattern. The resist film is then developed so as to pattern the resist film 14. The resist film patterns 14 thus obtained cover the light shielding film patterns 11a, 11b, 11c in the first region A, with the light shielding film patterns 12 in the second region B left exposed to the outside, as shown in FIG. 3A. Then, the chromium film patterns 12 are removed by etching with the resist film patterns 14 used as masks, as shown in FIG. 3B, followed by removing the resist film patterns 14 covering the first region A. In this fashion, a photomask is prepared as shown in FIG. 3C. The width of each of the light shielding film patterns 11a is about 0.7 µm on the photomask, and the space between the adjacent shielding film patterns 11a is about 0.7 µm.

In the photomask formed in this embodiment, the light shielding film patterns can be formed substantially as designed in respect of each of the collective arrangement pattern i.e. dense arrangement pattern and the independent arrangement pattern i.e. isolated arrangement pattern so as to diminish the difference between the size of the light shielding film patterns 11a of the collective arrangement pattern and the size of the light shielding film pattern 11b, 11c of the independent arrangement pattern.

Figure 4A:
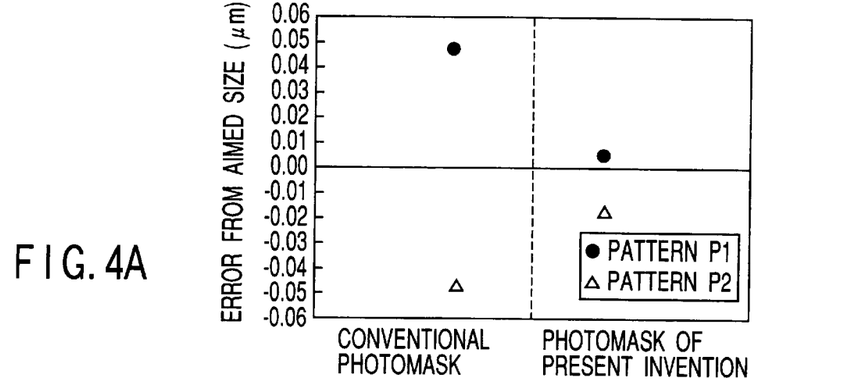
FIG. 4A shows the differences from the aimed size caused by the difference in the light shielding film pattern in respect of the photomask formed by the method of the present invention and the photomask formed by the conventional method.
Figure 4B:
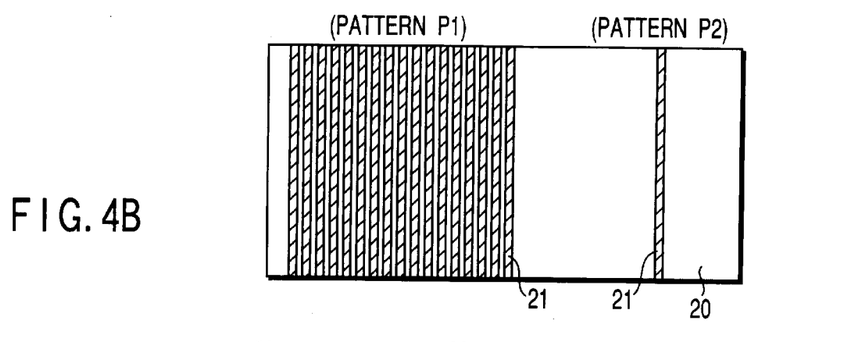
FIG. 4B is a plan view showing a photomask in which patterns of a light shielding film are formed.

The characteristics of a photomask formed by the method of the present invention will now be described with reference to FIGS. 4A and 4B. Specifically, FIG. 4A shows the characteristics in terms of the error from the aimed size of the light shielding film patterns in the collective arrangement pattern P1 and the error from the aimed size of the light shielding film pattern in the independent arrangement pattern P2, in respect of a photomask formed by the method of the present invention and a photomask formed by the conventional method, and FIG. 4B is a plan view showing the photomask having a light shielding film pattern formed therein. As shown in FIG. 4B, the photomask comprises a transparent substrate 20 such as a glass substrate, and a light shielding film patterns 21 obtained by patterning, for example, a chromium film, which are formed on the substrate 20. The arrangements of the light shielding film patterns 21 comprise a pattern P1 that is a dense or collective arrangement pattern and a pattern P2 that is an independent arrangement pattern.

The photomask of the present invention is formed as follows. In the first step, a light shielding film 21 consisting of a chromium film is formed on the entire surface of the transparent substrate 20 by means of a vacuum vapor deposition or a sputtering method, followed by coating the light shielding film 21 consisting of the chromium film is coated with a resist film. Then, the resist film is selectively exposed to light or an electron beam so as to depict a predetermined pattern on the resist film, followed by developing the resist film so as to form resist film patterns. In the next step, light shielding film patterns are formed by etching the light shielding film 21 consisting of chromium film with the resist film patterns used as masks. Thereafter, the resist film patterns 13 are removed. As a result, light shielding film patterns made of chromium are formed on the surface of the transparent substrate. The surface of the transparent substrate includes a first region A and a second region B. Light shielding film patterns forming mask patterns are formed in the first region A, and light shielding film patterns used as dummy patterns are formed on the entire surface of the second region B. In the next step, a resist film is formed on the main surface of the transparent substrate in a manner to cover the light shielding film patterns 20, followed by irradiating the resist film with light or an electron beam so as to depict a predetermined pattern. The resist film is then developed so as to pattern the resist film 14. The resist film is then developed to form resist film patterns. The resist film patterns cover the light shielding film patterns in the first region A without covering the light shielding film patterns in the second region B. Then, the chromium film patterns i.e. dummy patterns in the second region B are removed by etching with the resist film patterns 14 covering the first region A used as masks, followed by removing the resist film patterns. In this fashion, a photomask is prepared by the method of the present invention.

In the photomask formed in this embodiment, the light shielding film patterns are formed substantially as designed in respect of each of the collective arrangement pattern P1 and the independent arrangement pattern P2 so as to diminish the error from the aimed size of the light shielding film patterns of the collective arrangement pattern P1 and the error from the aimed size of the light shielding film pattern of the independent arrangement pattern P2. Thus, the difference in size between the light shielding film patterns in the collective arrangement pattern P1 and the light shielding film pattern in the independent arrangement pattern P2 is small. As shown in FIG. 4A, the difference of about 0.095 µm was recognized between the error from the aimed size of pattern P1 (collective arrangement pattern) and the error from the aimed size of pattern P2 (independently arrangement pattern) in the photomask prepared by the conventional method. In the photomask prepared by the method of the present invention, however, the difference was only about 0.020 μm so as to markedly improve the size difference between the sparse and dense patterns.

A second embodiment of the present invention will now be described with reference to FIGS. 5A to 7B.

Figure 5A:
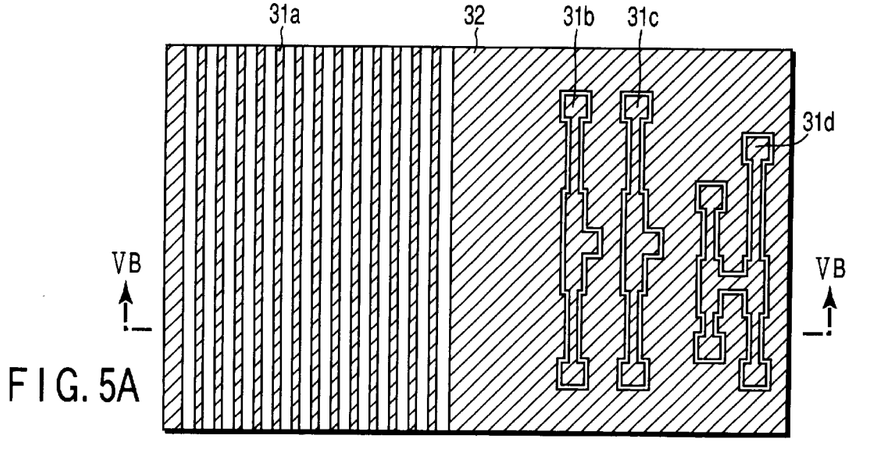
FIG. 5A is a plan view showing a photomask in a step of the manufacturing method according to the present invention.
Figure 5B:
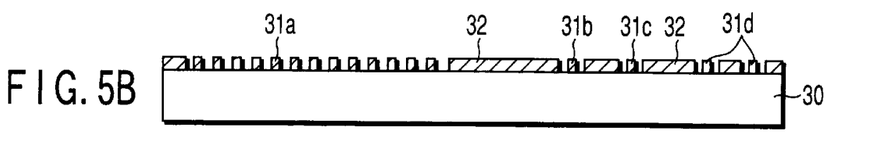
FIG. 5B is a cross sectional view along the line VB—VB shown in FIG. 5A.
Figure 6A:
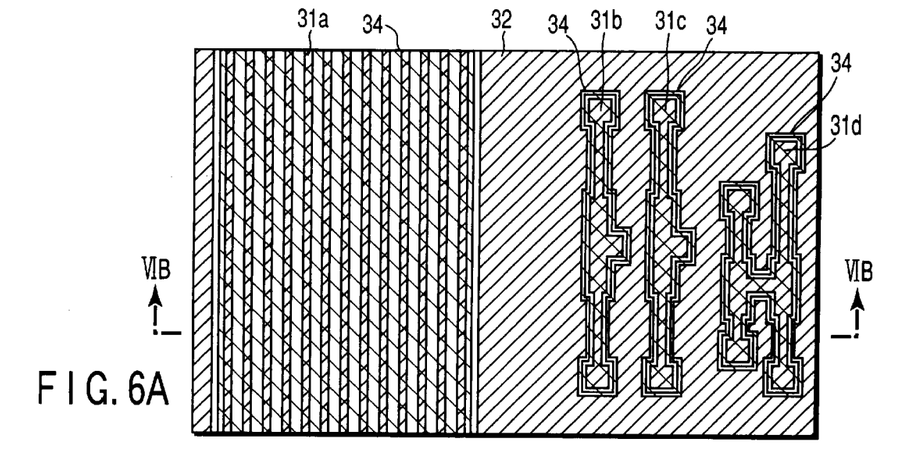
FIG. 6A is a plan view showing the photomask of FIG. 5A in another step of the manufacturing method according to the present invention, in which the region of the collective arrangement pattern of the photomask is covered with a photoresist film pattern.
Figure 6B:
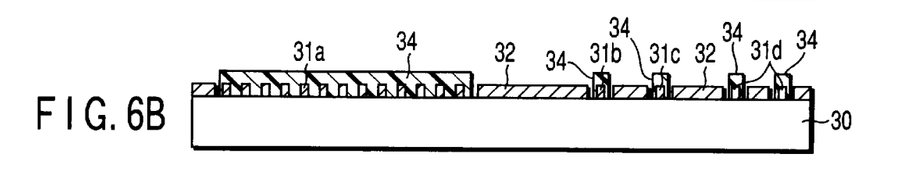
FIG. 6B is a cross sectional view along the line VIB—VIB shown in FIG. 6A.
Figure 7A:
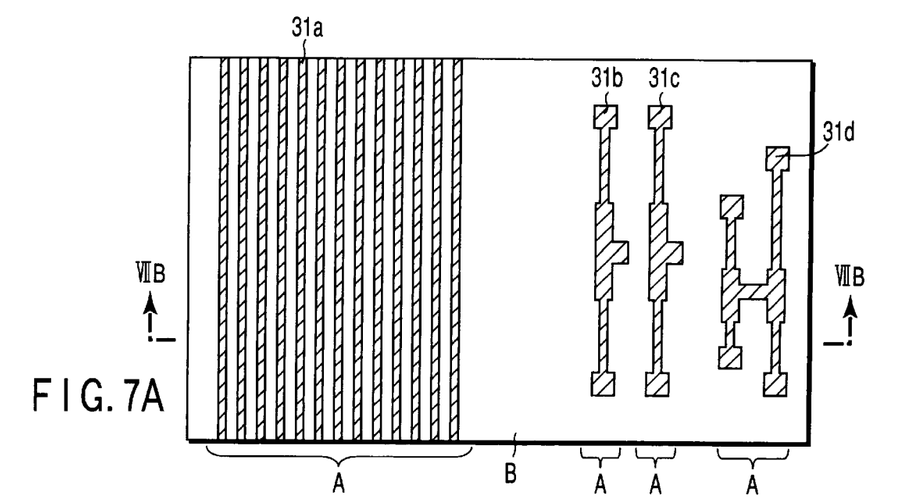
FIG. 7A is a plan view showing the photomask of FIGS. 5A and 6A in a further step of the manufacturing method according to the present invention.
Figure 7B:
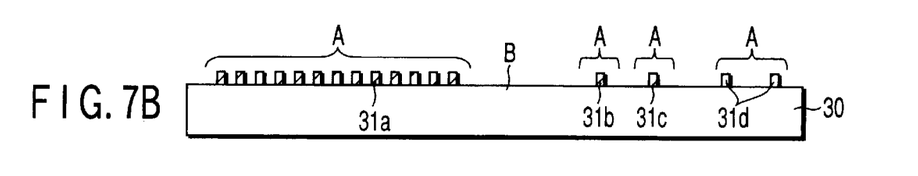
FIG. 7B is a cross sectional view along the line VIIB—VIIB shown in FIG. 7A.

Specifically, FIG. 5A is a plan view showing a photomask in a step of the manufacturing method according to the present invention. FIG. 5B is a cross sectional view along the line VB—VB shown in FIG. 5A. FIG. 6A is a plan view showing the photomask of FIG. 5A in another step of the manufacturing method according to the present invention, in which a first region of the mask is covered with a photoresist film pattern. FIG. 6B is a cross sectional view along the line VIB—VIB shown in FIG. 6A. FIG. 7A is a plan view showing the photomask of FIGS. 5A and 6A in a further step of the manufacturing method according to the present invention. FIG. 7B is a cross sectional view along the line VIIB—VIIB shown in FIG. 7A.

In this embodiment, a photomask pattern is formed of a translucent phase shift film. If the distance between the patterns is diminished in the ordinary photomask using a chromium film, the light is spread into the dark pattern portion that is originally not exposed to light and spread light beams overlap each other so as to intensify the light, with the result that the dark pattern portion is also exposed to light. In the case of using a phase shift mask, however, the phase of the light having passed through the phase shift film is deviated by π, with the result that the light beams spread into the dark pattern portion are allowed to weaken each other. It follows that the dark pattern portion is not exposed to light. Therefore, the phase shift mask has a high resolution and, thus, is adapted for use in the manufacture of a further miniaturized semiconductor device, compared with the ordinary photomask. The phase shift mask includes a mask using a light shielding film made of, for example, a chromium compound such as chromium fluoride, which is used for forming a phase shift film and a half tone film on a transparent substrate, or a molybdenum silicide compound such as oxynitride molybdenum silicide.

The manufacturing process of the photomask will now be described with reference to FIGS. 5A to 7B. In the first step, a light shielding film made of chromium fluoride, which is also used as a phase shift film and a half tone film, is formed on the entire surface of a transparent substrate such as a glass substrate by, for example, a sputtering method, followed by forming a resist film on the chromium fluoride film by means of coating. Then, the resist film is selectively exposed to light or an electron beam so as to depict a predetermined pattern, followed by developing the resist film to form resist film patterns.

In the next step, light shielding film patterns are formed by etching the light shielding film with the resist film patterns used as masks. Thereafter, the resist film patterns are removed. As a result, light shielding film patterns are formed on the surface of the transparent substrate. The surface of the transparent substrate includes a first region A and a second region B. Light shielding film patterns 31a, 31b, 31c and 31d used as a mask pattern are formed in the first region A, and light shielding film patterns 32 used as a dummy pattern are formed on the entire surface of the second region B, as shown in FIGS. 5A and 5B. In the next step, a resist film 34 is formed on the main surface of the transparent substrate 30 in a manner to cover the shielding film patterns, followed by selectively irradiating the resist film 34 with light or an electron beam in a predetermined pattern. The resist film 34 is then developed to form resist film patterns 34. The resist film patterns 34 cover the light shielding films 31a, 31b, 31c, and 31d in the first region A, with the light shielding films 32 in the second region B left exposed to the outside, as shown in FIGS. 6A and 6B. Then, the light shielding film patterns 32 used as a dummy pattern are removed by etching with the patterned resist films 34 used as a mask, followed by removing the resist film patterns 34 covering the first region A, thereby forming a photomask as shown in FIGS. 7A and 7B.

In the photomask formed in this embodiment, the light shielding film patterns are formed substantially as designed in respect of each of the collective arrangement pattern and the independent arrangement pattern so as to diminish the difference between the size of the light shielding film patterns 31a in the collective arrangement pattern and the size of the light shielding film pattern 31b, 31c, 31d in the independent arrangement pattern.

A third embodiment of the present invention will now be described with reference to FIGS. 8A to 8F.

Figure 8A:
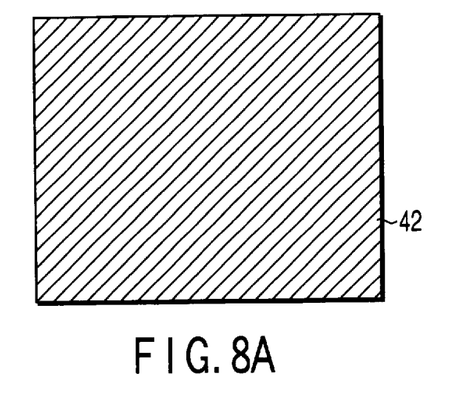
FIGS. 8A to 8F are plan views each showing a dummy pattern formed on an photomask in a step of the manufacturing method according to the present invention.
Figure 8B:
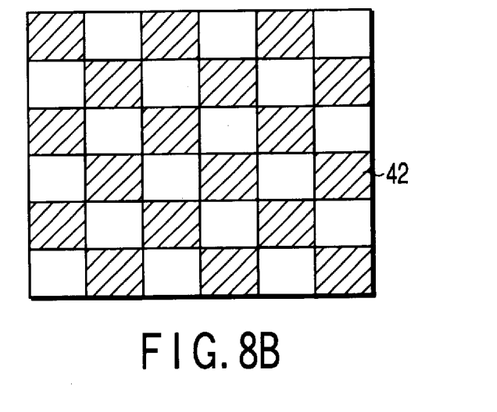
Figure 8C:
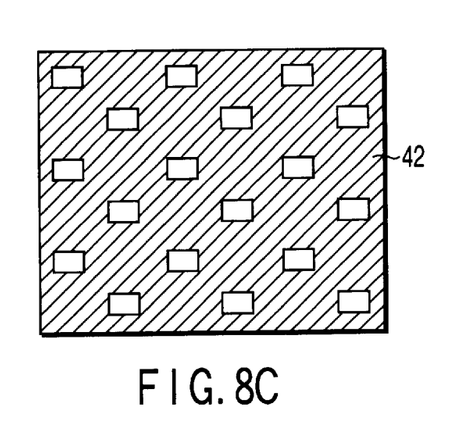
Figure 8D:
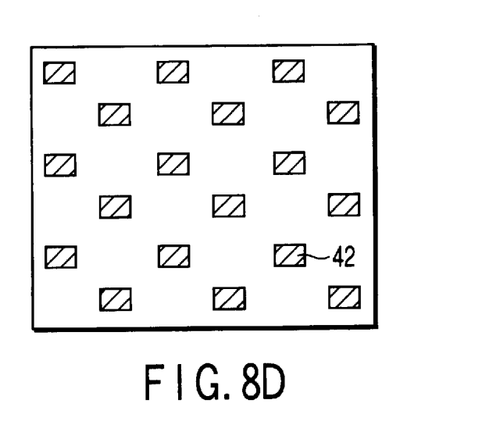
Figure 8E:
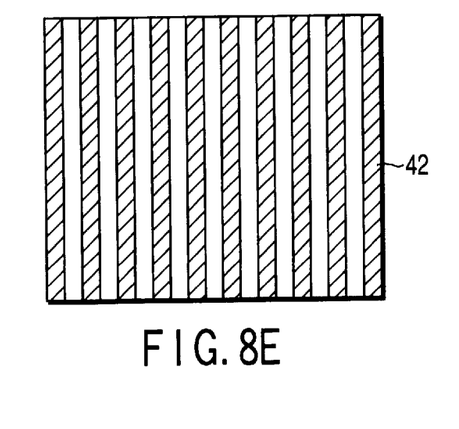
Figure 8F:
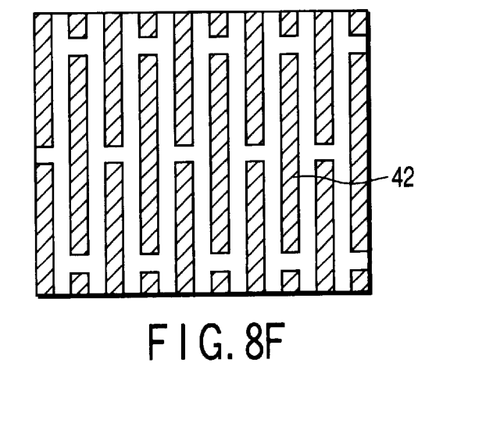

This embodiment is featured in that dummy patterns differing from each other in the covering ratio are used. Specifically, FIGS. 8A to 8F are plan views each showing a dummy pattern 42 formed on a transparent film in a step of the manufacturing process of the photomask of the present invention. Each dummy pattern 42 is used as a pattern like the dummy pattern 12 (see FIG. 1B) formed on the main surface of the transparent substrate 10, according to the first embodiment of the present invention. FIG. 8A covers the case where the dummy pattern 42 is formed of a pattern covered entirely with a light shielding film such as a chromium film. FIG. 8B covers case where the entire surface is not covered with a light shielding film and checker pattern is applied as a dummy pattern 42. Each of FIGS. 8C and 8D shows a dummy pattern 42 shaped like a contact hole pattern or a dot pattern. Further, each of FIGS. 8E and 8F shows a pattern 42 shaped like a line and space pattern.

In this embodiment, the covering ratio of the dummy pattern, which is shaped as described above, is changed appropriately. In the dry etching step for forming a mask pattern of the photomask, a phenomenon has been confirmed that the etching rate is changed depending on the covering ratio of the pattern.

The wiring pattern on a semiconductor substrate is formed as follows by using a photomask formed by the method of the present invention.

FIGS. 9A to 9E are cross sectional views collectively showing the manufacturing process of a semiconductor substrate according to the present invention.

Figure 9A:
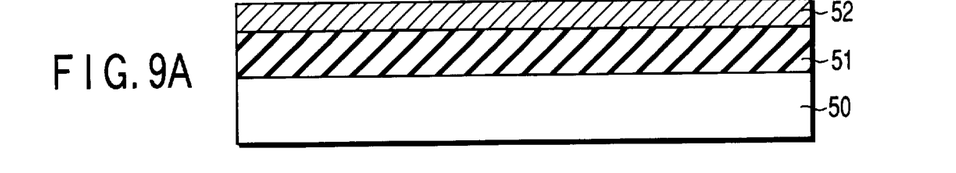
FIGS. 9A to 9E are cross sectional views collectively showing a manufacturing process of a semiconductor device of the present invention.
Figure 9B:
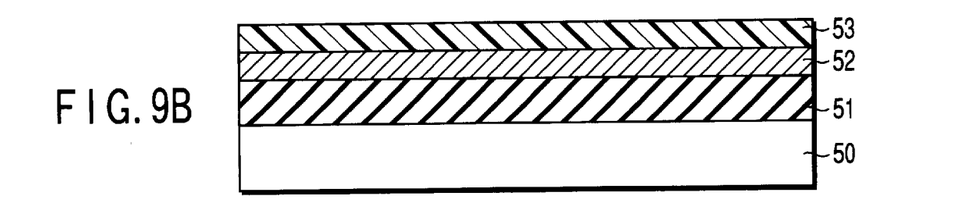
Figure 9C:
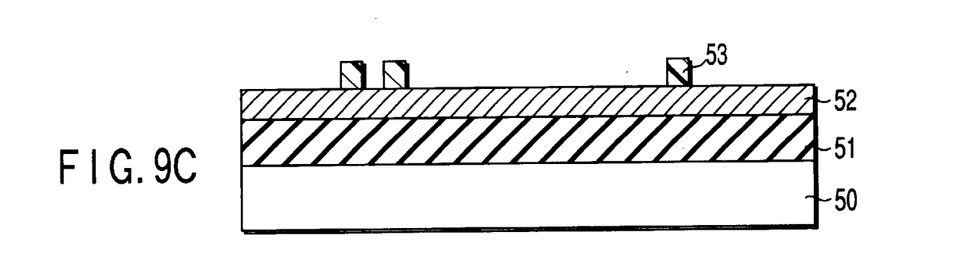
Figure 9D:
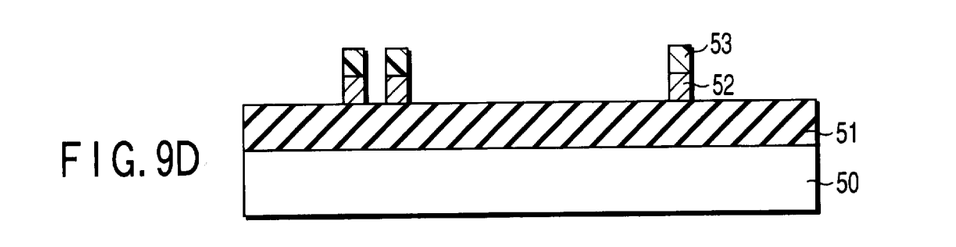
Figure 9E:
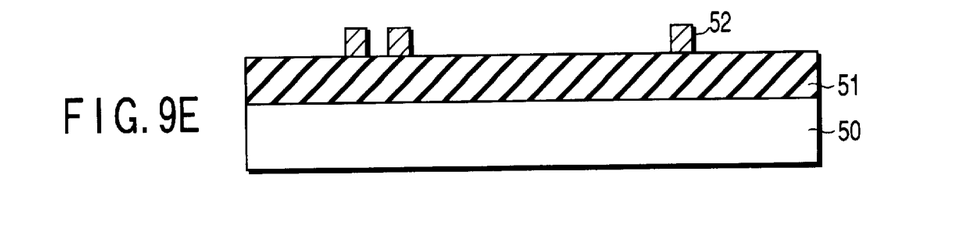

In the first step, a metal film 52 such as an aluminum film is formed on a semiconductor substrate 50 such as a silicon substrate having a semiconductor element, not shown, formed thereon with an interlayer insulating film 51 interposed between the semiconductor substrate and the metal film, as shown in FIG. 9A. Then, a photoresist film 53 is formed on the entire surface of the metal film 52, followed by transferring a predetermined pattern onto the photoresist film by using a photomask formed by the method of the present invention, as shown in FIG. 9B. The resist film 53 having the pattern transferred thereonto is developed to form a resist film pattern 53, as shown in FIG. 9C. Further, the metal film 52 is etched with the resist film pattern used as a mask, thereby forming a wiring pattern 52 on the semiconductor substrate, as shown in FIG. 9D. Then, the resist film pattern 53 is removed, as shown in FIG. 9E. Thus, the difference between the CAD data (depiction data) and the finish size, i.e., the conversion difference, is caused to be different by the difference in the etching rate noted above. As a result, it is difficult to finish all the pattern sizes having various pattern covering ratios as aimed.

If the covering ratio is the same, the conversion difference is rendered uniform so as to facilitate the control of the pattern size. The adjustment of the covering ratio can be performed by adjusting the covering ratio of the dummy pattern portion as described in the embodiments of the present invention.

According to the present invention, it is possible to markedly diminish the difference in size between the light shielding film patterns in the collective arrangement pattern and the light shielding film pattern the independent arrangement pattern so as to improve the size uniformity of the patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a photomask, comprising the steps of:
    successively laminating a light shielding film and a first resist film on a surface of a transparent substrate;
    patterning said first resist film to form a first resist film pattern;
    etching said light shielding film with the first resist film pattern used as a mask so as to form a single light shielding film pattern of said light shielding film in a form of an independent arrangement pattern and a plurality of light shielding film patterns of said light shielding film in a form of a collective arrangement pattern in a first region of the surface of the transparent substrate and a dummy pattern of said light shielding film in a second region of the surface of the transparent substrate;
    removing the first resist film pattern;
    forming a second resist film on the surface of the transparent substrate to cover said light shielding film patterns in the first regions and the second regions of the surface of the transparent substrate;
    patterning said second resist film to form a second resist film pattern on the first region of the surface of the transparent substrate; and
    removing by etching the dummy pattern in said second region with the second resist film pattern used as a mask.

2. The method of forming a photomask according to claim 1, wherein said light shielding film pattern and said dummy pattern comprise a chromium film or a translucent phase shift film.

3. The method of forming a photomask according to claim 2, wherein said translucent phase shift film comprises a light shielding film made of a chromium compound or a molybdenum silicide compound.

4. The method of forming a photomask according to claim 3, wherein said chromium compound of the light shielding film is chromium fluoride.

5. The method of forming a photomask according to claim 3, wherein said molybdenum silicide compound of the light shielding film is oxynitride molybdenum silicide.

6. The method of forming a photomask according to claim 1, wherein said second region has a region in which said light shielding film is not formed, and an optional value is selected as the covering ratio in said second region of said light shielding film in accordance with the etching conditions of said light shielding film pattern.

7. The method of forming a photomask according to claim 1, further comprising, the step performed after the step removing by etching the dummy pattern in said second region, of removing the second resist film pattern.

8. The method of forming a photomask according to claim 7, wherein said light shielding film pattern and said dummy pattern comprise a chromium film or a translucent phase shift film.

9. The method of forming a photomask according to claim 8, wherein said translucent phase shift film comprises a light shielding film made of a chromium compound or a molybdenum silicide compound.

10. The method of forming a photomask according to claim 9, wherein said chromium compound of the light shielding film is chromium fluoride.

11. The method of forming a photomask according to claim 9, wherein said molybdenum silicide compound of the light shielding film is oxynitride molybdenum silicide.

12. The method of forming a photomask according to claim 7, wherein said second region has a region in which said light shielding film is not formed, and an optional value is selected as the covering ratio in said second region of said light shielding film in accordance with the etching conditions of said light shielding film pattern.

13. A method of forming a photomask, comprising the steps of:
    forming a light shielding film on a surface of a transparent substrate;
    forming a first resist film pattern on the light shielding film;
    etching said light shielding film with the first resist film pattern used as a mask so as to form a single light shielding film pattern of said light shielding film in a form of an independent arrangement pattern and a plurality of light shielding film patterns of said light shielding film in a form of a collective arrangement pattern in a first region of the surface of the transparent substrate and a dummy pattern of said light shielding film in a second region of the surface of the transparent substrate;
    removing the first resist film pattern;
    forming a second resist film pattern on the surface of the transparent substrate to cover said light shielding film patterns in the first region of the surface of the transparent substrate; and
    removing by etching the dummy pattern in said second region with the second resist film pattern used as a mask.

14. The method of forming a photomask according to claim 13, wherein said light shielding film pattern and said dummy pattern comprise a chromium film or a translucent phase shift film.

15. The method of forming a photomask according to claim 14, wherein said translucent phase shift film comprises a light shielding film made of a chromium compound or a molybdenum silicide compound.

16. The method of forming a photomask according to claim 15, wherein said chromium compound of the light shielding film is chromium fluoride.

17. The method of forming a photomask according to claim 15, wherein said molybdenum silicide compound of the light shielding film is oxynitride molybdenum silicide.

18. The method of forming a photomask according to claim 13, wherein said second region has a region in which said light shielding film is not formed, and an optional value is selected as the covering ratio in said second region of said light shielding film in accordance with the etching conditions of said light shielding film pattern.

19. The method of forming a photomask according to claim 13, further comprising, the step performed after the step removing by etching the dummy pattern in said second region, of removing the second resist film pattern.

20. The method of forming a photomask according to claim 19, wherein said light shielding film pattern and said dummy pattern comprise a chromium film or a translucent phase shift film.

21. The method of forming a photomask according to claim 20, wherein said translucent phase shift film comprises a light shielding film made of a chromium compound or a molybdenum silicide compound.

22. The method of forming a photomask according to claim 21, wherein said chromium compound of the light shielding film is chromium fluoride.

23. The method of forming a photomask according to claim 21, wherein said molybdenum silicide compound of the light shielding film is oxynitride molybdenum silicide.

24. The method of forming a photomask according to claim 19, wherein said second region has a region in which said light shielding film is not formed, and an optional value is selected as the covering ratio in said second region of said light shielding film in accordance with the etching conditions of said light shielding film pattern.

25. A method of manufacturing a semiconductor device, comprising the steps of:
    forming a workpiece film on a surface of a semiconductor substrate;
    forming a photoresist film on said workpiece film;
    transferring a predetermined pattern onto said photoresist film using a photomask;
    developing the photoresist film having said pattern formed thereon and patterning the developed photoresist film to form a photoresist film pattern; and
    etching said workpiece film with the photoresist film pattern used as a mask to form film patterns of the workpiece film in a first portion of the surface of the semiconductor substrate and film patterns of the workpiece film in a second portion of the surface of the semiconductor substrate,
    wherein said photomask is a photomask formed by the method of forming a photomask defined in claim 1.

26. The method of manufacturing a semiconductor device according to claim 25, wherein the film patterns of the workpiece film in the first portion of the surface of the semiconductor substrate are arranged in a low density and the film patterns of the workpiece film in the second portion of the surface of the semiconductor substrate are arranged in a high density.

27. The method of manufacturing a semiconductor device according to claim 25, wherein the film patterns in the first portion and the second portion comprise conductor wirings or gate electrodes.

28. The method of manufacturing a semiconductor device according to claim 25, wherein said photomask is a photomask formed by the method of forming a photomask wherein said light shielding film pattern and said dummy pattern comprise a chromium film or a translucent phase shift film.

29. The method of manufacturing a semiconductor device according to claim 25, wherein said photomask is a photomask formed by the method of forming a photomask wherein said second region has a region in which said light shielding film is not formed, and an optional value can be selected as the covering ratio in said second region of said light shielding film in accordance with the etching conditions of said light shielding film pattern.

30. The method of manufacturing a semiconductor device according to claim 25, wherein said photomask is a photomask formed by the method of forming a photomask wherein said light shielding film pattern and said dummy pattern comprise a chromium film or a translucent phase shift film.

31. The method of manufacturing a semiconductor device according to claim 25, wherein said photomask is a photomask formed by the method of forming a photomask wherein said second region has a region in which said light shielding film is not formed, and an optional value can be selected as the covering ratio in said second region of said light shielding film in accordance with the etching conditions of said light shielding film pattern.

32. A method of manufacturing a semiconductor device, comprising the steps of:
    forming a workpiece film on a surface of a semiconductor substrate;
    forming a photoresist film on said workpiece film;
    transferring a predetermined pattern onto said photoresist film using a photomask;
    developing the photoresist film having said pattern formed thereon and patterning the developed photoresist film to form a photoresist film pattern; and
    etching said workpiece film with the photoresist film pattern used as a mask to form film patterns of the workpiece film in a first portion of the surface of the semiconductor substrate and film patterns of the workpiece film in a second portion of the surface of the semiconductor substrate,
    wherein said photomask is a photomask formed by the method of forming a photomask defined in claim 13.

33. The method of manufacturing a semiconductor device according to claim 32, wherein the film patterns of the workpiece film in the first portion of the surface of the semiconductor substrate are arranged in a low density and the film patterns of the workpiece film in the second portion of the surface of the semiconductor substrate are arranged in a high density.

34. The method of manufacturing a semiconductor device according to claim 32, wherein the film patterns in the first portion and the second portion comprise conductor wirings or gate electrodes.

35. The method of manufacturing a semiconductor device according to claim 32, wherein said photomask is a photomask formed by the method of forming a photomask wherein said light shielding film pattern and said dummy pattern comprise a chromium film or a translucent phase shift film.

36. The method of manufacturing a semiconductor device according to claim 32, wherein said photomask is a photomask formed by the method of forming a photomask wherein said second region has a region in which said light shielding film is not formed, and an optional value can be selected as the covering ratio in said second region of said light shielding film in accordance with the etching conditions of said light shielding film pattern.

37. The method of manufacturing a semiconductor device according to claim 32, wherein said photomask is a photomask formed by the method of forming a photomask wherein said light shielding film pattern and said dummy pattern comprise a chromium film or a translucent phase shift film.

38. The method of manufacturing a semiconductor device according to claim 32, wherein said photomask is a photomask formed by the method of forming a photomask wherein said second region has a region in which said light shielding film is not formed, and an optional value can be selected as the covering ratio in said second region of said light shielding film in accordance with the etching conditions of said light shielding film pattern.

* * * * *